US009140765B1

(12) United States Patent
Bulsara et al.

(10) Patent No.: US 9,140,765 B1
(45) Date of Patent: Sep. 22, 2015

(54) INJECTION LOCKED NONLINEAR DYNAMIC SYSTEM

(71) Applicants: Adi Ratan Bulsara, San Diego, CA (US); Salvatore Baglio, San Giovanni la Punta (IT); Bruno Ando, Aci Catena (IT); Fabio Antoci, Ragusa (IT); Carlo Trigona, Syracuse (IT); Nigel Stocks, Coventry (GB); Alexander Nikitin, Coventry (GB)

(72) Inventors: Adi Ratan Bulsara, San Diego, CA (US); Salvatore Baglio, San Giovanni la Punta (IT); Bruno Ando, Aci Catena (IT); Fabio Antoci, Ragusa (IT); Carlo Trigona, Syracuse (IT); Nigel Stocks, Coventry (GB); Alexander Nikitin, Coventry (GB)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/609,796

(22) Filed: Jan. 30, 2015

(51) Int. Cl.
*H03L 7/06* (2006.01)
*G01R 33/00* (2006.01)
*G01R 33/04* (2006.01)
*H03L 7/093* (2006.01)

(52) U.S. Cl.
CPC ............ *G01R 33/0029* (2013.01); *G01R 33/04* (2013.01); *H03L 7/093* (2013.01)

(58) Field of Classification Search
USPC .................................. 327/155, 117
See application file for complete search history.

(56) References Cited

U.S. PATENT DOCUMENTS

| | | | | |
|---|---|---|---|---|
| 5,835,199 A | * | 11/1998 | Phillips et al. | 356/5.03 |
| 7,528,606 B1 | * | 5/2009 | In et al. | 324/326 |
| 7,777,535 B1 | | 8/2010 | In et al. | |
| 7,898,250 B2 | * | 3/2011 | In et al. | 324/253 |
| 8,049,486 B1 | * | 11/2011 | In et al. | 324/72 |
| 8,049,570 B1 | * | 11/2011 | In et al. | 331/57 |
| 8,174,325 B1 | * | 5/2012 | Leung et al. | 331/2 |
| 8,212,569 B1 | * | 7/2012 | In et al. | 324/457 |
| 8,994,461 B1 | * | 3/2015 | In et al. | 331/57 |
| 2008/0164916 A1 | * | 7/2008 | Petrovic et al. | 327/117 |
| 2008/0258783 A1 | * | 10/2008 | Petrovic | 327/119 |
| 2010/0034223 A1 | * | 2/2010 | Osinski et al. | 372/18 |
| 2014/0270786 A1 | * | 9/2014 | Poddar et al. | 398/116 |
| 2015/0086151 A1 | * | 3/2015 | Delfyett et al. | 385/3 |

OTHER PUBLICATIONS

Inchiosa et al.; Stochastic Dynamics in a Two-Dimensional Oscillator Near a Saddle-Node Bifurcation; Phys. Rev. E63, 066114; 2001.
Bulsara et al.; Injection Locking Near a Stochastic Bifurcation: the dc SQUID as a Case Study; Phsica A325, 220; 2003.

(Continued)

*Primary Examiner* — Adam Houston
(74) *Attorney, Agent, or Firm* — SPAWAR Systems Center Pacific; Kyle Eppele; J. Eric Anderson

(57) ABSTRACT

A nonlinear dynamic system comprising: a number N of nonlinear components, wherein each nonlinear component experiences intrinsic oscillation when a coupling parameter $\lambda$ is tuned past a threshold value, and wherein the nonlinear components are unidirectionally coupled together in a ring configuration; and a signal generator configured to generate N coherent locking signals; wherein each locking signal is phase shifted by $2\pi/N$ with respect to the other locking signals; and wherein the signal generator is coupled to the nonlinear components such that each locking signal locks a frequency of the intrinsic oscillation of one of the nonlinear components to a frequency of the locking signal.

18 Claims, 11 Drawing Sheets

(56) References Cited

OTHER PUBLICATIONS

Ando' et al.; Injection-Locking Benefits for weak AC magnetic field detection in Coupled-Core Fluxgate Magnetometers; IEEE, 2012.

Antoci et al.; Injection Locking in Coupled Core Fluxgate Magnetometers: Exploiting Nonlinearity to Enhance Sensitivity to Weak, Low Frequency, Target Magnetic Fields; IEEE Sensors Journal, vol. 14 No. 2, Feb. 2014.

* cited by examiner

INJECTION LOCKED NONLINEAR DYNAMIC SYSTEM

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 102576.

BACKGROUND OF THE INVENTION

The invention disclosed herein relates to nonlinear dynamical systems. Nonlinear dynamic systems are known to display very rich behavior just past a critical point at which a bifurcation has occurred. In this regime they are also particularly sensitive to small perturbing signals, a fact that can be exploited for the detection of weak signals. This property is, however, somewhat offset by the system noise floor which is, also, amplified via the same mechanism in this regime. Accordingly, novel techniques for noise suppression become distinctly important when one designs and configures nonlinear dynamical sensors for detecting weak, low frequency, target signals.

SUMMARY

Disclosed herein is a nonlinear dynamic system comprising a number N of nonlinear components and a signal generator. Each nonlinear component experiences intrinsic oscillation when a coupling parameter $\lambda$ is tuned past a threshold value. The nonlinear components are unidirectionally coupled together in a ring configuration. The signal generator is configured to generate N coherent locking signals. Each locking signal is phase shifted by $2\lambda/N$ with respect to the other locking signals. The signal generator is coupled to the nonlinear components such that each locking signal locks a frequency of the intrinsic oscillation of one of the nonlinear components to a frequency of the locking signal.

A method for providing the nonlinear dynamic system disclosed herein comprises the following steps. First, one must provide a number N of nonlinear components. The next step provides for unidirectionally coupling the nonlinear components together in a ring configuration. The next step provides for tuning a coupling parameter $\lambda$ past a threshold value for each nonlinear component such that each nonlinear component experiences intrinsic oscillation. The next step provides for coupling the nonlinear components to a signal generator. The next step provides for generating with the signal generator a locking signal having an amplitude and a frequency within an Arnold tongue. The next step provides for coupling the locking signal to the nonlinear components such that frequencies of intrinsic oscillation of the nonlinear components are frequency locked to the frequency of the locking signal.

BRIEF DESCRIPTION OF THE DRAWINGS

The patent or application file contains at least one drawing executed in color. Copies of this patent or patent application publication with color drawing(s) will be provided by the Office upon request and payment of the necessary fee. Throughout the several views, like elements are referenced using like references. The elements in the figures are not drawn to scale and some dimensions are exaggerated for clarity.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
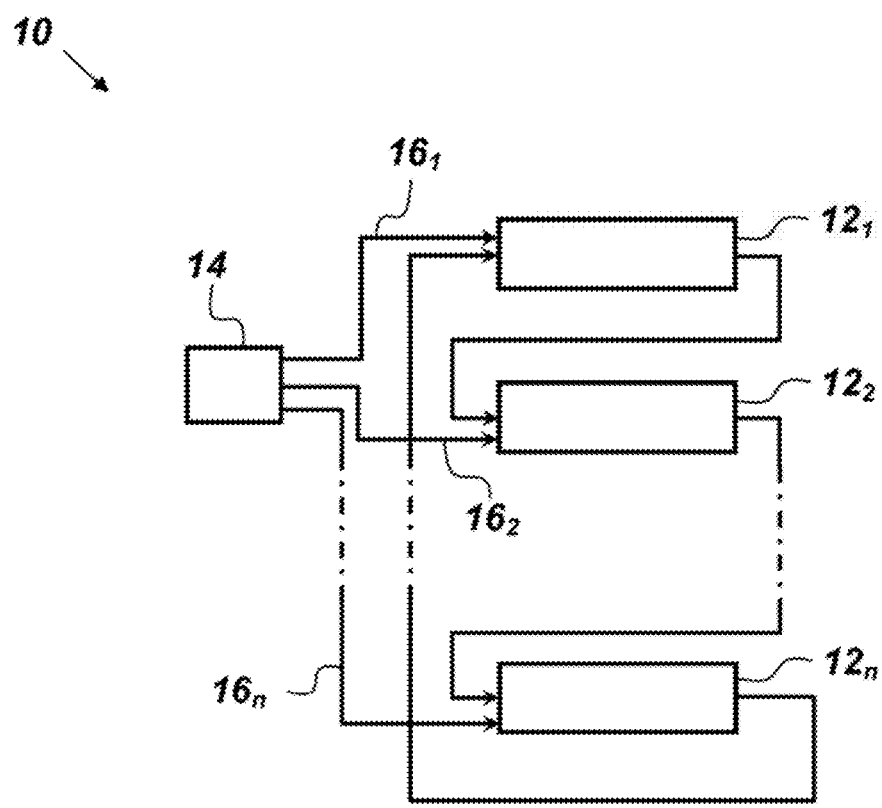
FIG. 1 is an illustration of a nonlinear dynamic system.

FIG. 1 is an illustration of a nonlinear dynamic system 10 that comprises, consists of, or consists essentially of a number N of nonlinear components 12, and a signal generator 14. The nonlinear components 12 are unidirectionally coupled together in a ring configuration and each nonlinear component 12 may experience intrinsic oscillation (in its state variable) when a coupling parameter $\lambda$ is tuned past a threshold value; without coupling, there are no oscillations. The signal generator 14 may be configured to generate N coherent locking signals 16. Each locking signal 16 may be phase shifted by $2\lambda/N$ with respect to the other locking signals 16. The signal generator 14 may be coupled to the nonlinear components 12 such that each locking signal 16 locks a frequency of the intrinsic oscillation of one of the nonlinear components 12 to a frequency of the locking signal 16.

The nonlinear dynamic system 10 may be used to exploit very rich behavior that results when nonlinear dynamic elements, such as the nonlinear components 12, are connected using carefully crafted coupling schemes. An example of the nonlinear system 10 is a coupled core fluxgate magnetometer (CCFG). The nonlinear dynamic system 10 may develop relaxation-type oscillations in its state variables when the system is driven through a critical point; the characteristics of these oscillations depend on the dimensionality of the system, the type of nonlinearity, and the coupling topology.

Injection locking may be used to lower the noise floor of the nonlinear dynamic system 10. Injection locking consists of applying an external periodic signal, such as the locking signals 16, at or near the characteristic oscillation frequency of the system. It is, therefore, applicable to systems of N>1 dimension which pass through a bifurcation from static to oscillatory or "running" behavior. The oscillation frequency is, directly, a function of the distance of the control (i.e. bifurcation) parameter from the critical point, and the oscillations are non-sinusoidal just past the critical point, approaching a sinusoidal time-dependence as one goes deeper into the oscillation regime. Application of the external (usually time-sinusoidal) locking signal results in a change in structure of the signal features in the power spectral density (PSD). Specifically, the spectral features move from a broad-base structure (characteristic of relaxation oscillators) towards a delta function structure (characteristic of time sinusoidal signals). With increasing locking amplitude, the spectral features become sharper; this is accompanied by a concomitant lowering of the noise-floor at all frequencies; thus, injection locking affords a route towards increased detectability and/or amplification of small amplitude target signals.

There exists a regime (defined by an "Arnold tongue") wherein one can achieve the injection locking effect (i.e. synchronization of the internal oscillation frequency to the locking signal) even for a finite detuning, by carefully adjusting the locking amplitude. In the absence of the locking signal, the response power spectral density (PSD) consists of broad peaks, corresponding to the running solution frequency and its higher harmonics, superimposed on a Lorentzian-like noise background, and injection locking results in a narrowing of the peaks in the PSD with a concomitant lowering of the noise-floor in particular at low frequencies. The important point to reiterate is that injection locking requires a characteristic internal oscillation that can synchronize to the (externally applied) locking signal 16. The nonlinear dynamic system 10 may be used to detect low frequency alternating current (AC) magnetic target signals.

A CCFG embodiment of the nonlinear dynamic system 10 will be described hereafter, but it is to be understood that the nonlinear dynamic system 10 is not limited to CCFGs. The nonlinear dynamic system 10 may be any nonlinear, dynamic sensor. The next section contains an overview of the dynamics of the CCFG embodiment.

Dynamic sensors often have nonlinear input-output characteristics corresponding to a bistable/multistable potential energy function that underpins the dynamics. The fluxgate magnetometer, one of the oldest and simplest devices for measuring changes in magnetic flux, resides in this class of sensors. In its simplest form, the fluxgate magnetometer consists of a ferromagnetic core which is often implemented by an amorphous nanowire that can be well characterized under the assumption that it is approximately a single magnetic domain thick. The core is wound with primary and secondary coils; it can be well-characterized by a dynamic continuum model underpinned by a potential energy function $U(x, t)$:

$$U(x, t) = \frac{x^2}{2} - \frac{1}{c}\ln\cosh[c(x + h(t))] \quad \text{Equation (1)}$$

$$\tau \frac{dx}{dt} = -\nabla_x U(x, t) = -x + \tanh[c(x + h(t))] \quad \text{Equation (2)}$$

where $\tau$ is a system time constant (approximately, the inverse of the device bandwidth), and $h(t)$ an external magnetic field, that may be time-dependent, having the dimension of $x(t)$, the averaged magnetization of the ferromagnetic core. The parameter $c$ is proportional to the inverse temperature, and the potential energy function is bistable for $c>1$. The CCFG, instead, is constructed by unidirectionally (and electrically) coupling $N(>2)$ wound ferromagnetic cores with cyclic boundary condition. In the case of N=3 this coupling leads to the following:

$$\begin{cases} \dot{x}_1 = -x_1 + \tanh[c(x_1 + \lambda x_3 + H_x)] \\ \dot{x}_2 = -x_2 + \tanh[c(x_2 + \lambda x_1 + H_x)] \\ \dot{x}_3 = -x_3 + \tanh[c(x_3 + \lambda x_2 + H_x)] \end{cases} \quad \text{Equation (3)}$$

where $x_i(t)$, ($i=1, 2, 3$) represents the (suitably normalized) magnetic flux at the output (i.e. in the secondary coil) of unit $i$, and $H_x \ll U_0$ is an external dc "target" magnetic flux, $U_0$ being the energy barrier height (absent the coupling) for each of the elements (assumed identical for theoretical purposes). Notice that the coupling term, having strength $\lambda$, which is assumed to be equal for all three elements, is inside the nonlinearity, a direct result of the mean-field nature of the description (the coupling is through the induction in the primary or "excitation" coil). The oscillatory behavior occurs even for $H_x=0$, however when $H_x\neq0$, the oscillation characteristics change; these changes can be exploited for signal quantification purposes. Note the absence of the bias signal (that is endemic to the single core fluxgate); in the dynamics in the coupled-core system, the oscillations (corresponding to switching events in each core between the allowed stable states) are generated by the coupling and the cyclic boundary condition.

The oscillations occur for any $N\geq3$ (N must be odd, unless the number is very large (i.e., $N\gg2$). The system described by equation (3) exhibits coupling-induced oscillatory behavior with the following features:

(a) The oscillations commence when the coupling coefficient exceeds a threshold value $$\lambda_c = [-H_x - x_{inf} + c^{-1}\tanh^{-1}x_{inf}]/x_{10} \quad \text{Equation (4)}$$

with $$x_{inf} = \sqrt{(c-1)/c}$$

and $x_{10}\sim1$ being the (positive) location of the minimum of the potential energy function, absent the coupling. Note that, in our convention, $\lambda<0$ so that oscillations occur for $|\lambda|>|\lambda_c|$ The oscillations which correspond to a sequential switching of the normalized magnetization variables $x_i$ between the stable steady states of their potential energy functions, are non-sinusoidal, approaching sinusoidal behavior as one goes farther past the critical point (i.e. deeper into the oscillating regime).

(b) The individual oscillations (in each elemental response) are separated in phase by $2\pi/N$, and have period $$T_i = \frac{N\pi}{\sqrt{cx_{inf}}}\left(\frac{1}{\sqrt{(\lambda_c - \lambda)x_{10}}} + \frac{1}{\sqrt{(\lambda_c - \lambda)x_{10} + 2H_x}}\right) \quad \text{Equation (5)}$$

which shows a characteristic dependence on the inverse square root of the bifurcation "distance" $\lambda_c-\lambda$ as well as the target signal $H_x$; these oscillations have been experimentally produced at frequencies ranging from a few Hz to high kHz.

(c) Changing the target field strength also changes the period, via its influence on the threshold $\lambda_c$; in addition, one immediately observes that increasing $H_x$ leads to $\lambda_c$ going to larger (and negative) values i.e. a larger $|\lambda|$ is required to drive the system past its critical point. For a fixed coupling strength, a critical target signal amplitude $H_{xc}=x_{10}|\lambda_{c0}-\lambda|$ will suppress the oscillations; here we set $\lambda_{c0}=[-x_{inf}+c^{-1}\tan h^{-1} x_{inf}]/x_{10}$ as the critical coupling value, absent a target signal.

(d) The residence Times Difference (RTD) can be computed as a quantifier of the measured quantity $H_x$; referring to the i-th core element output signal, it can be written:

$$\Delta = \frac{\pi}{\sqrt{cx_{inf}}}\left(\frac{1}{\sqrt{(\lambda_c-\lambda)x_{10}}} - \frac{1}{\sqrt{(\lambda_c-\lambda)x_{10}+2H_x}}\right) \quad \text{Equation (6)}$$

which vanishes (as expected) for $H_x=0$. The system responsivity, defined via the derivative $\partial\Delta/\partial H_x$, is found to increase dramatically near the critical point in the oscillatory regime. In practice, this is also the regime where noise-floor effects are significant; hence techniques to circumvent the noise-floor related problems are important.

A variation of the above coupling scheme is to reverse the orientation of successive cores so that the sign of the $H_x$ term in Eq. (3) alternates; for N odd, this guarantees that there will be two adjacent elements with the same sign of $H_x$. This alternating orientation arrangement is described by:

$$\dot{x}_i=-x_i+\tan h[c(x_i+\lambda x_{i+1 mod N}+(-1)^{i+1}H_x)] \quad \text{Equation (7)}$$

and may be implemented in the nonlinear dynamic system 10.

Figure 2:
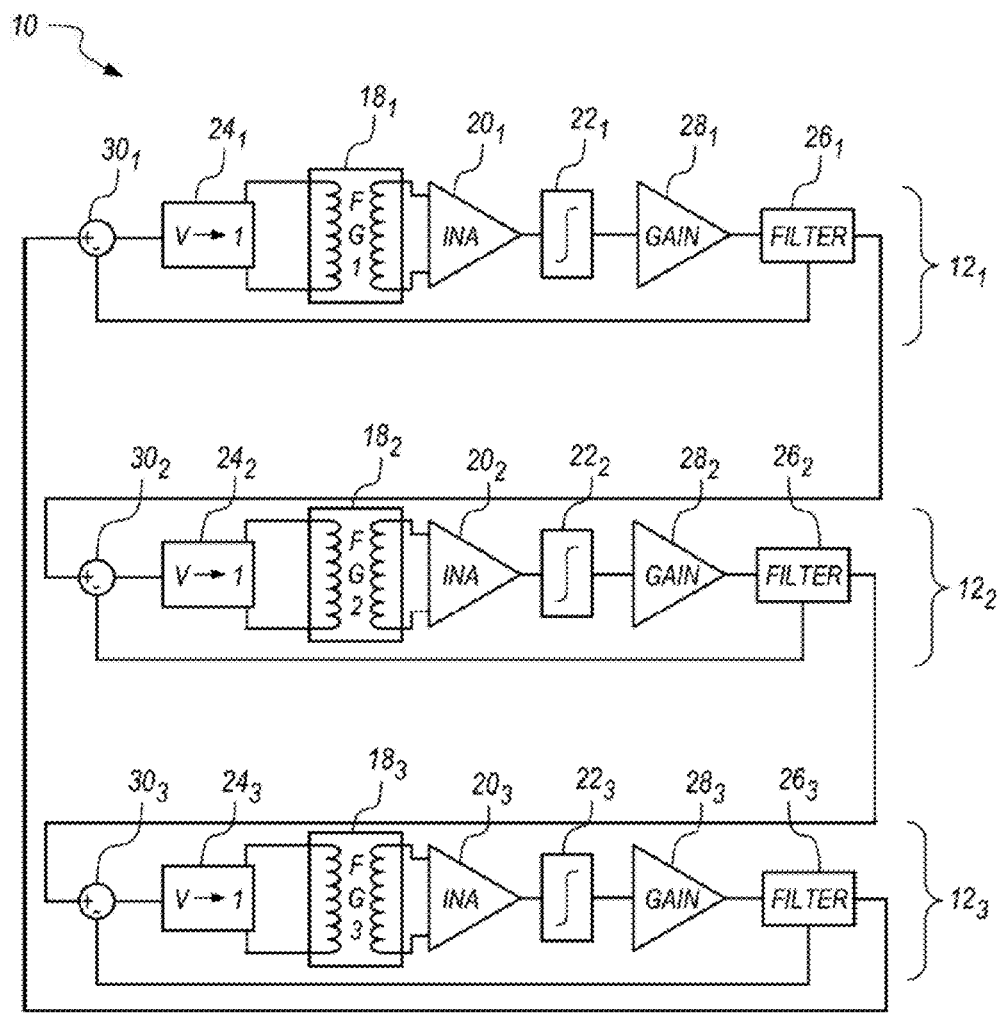
FIG. 2 is a block diagram of an embodiment of a nonlinear dynamic system.

FIG. 2 is a block diagram of an embodiment of the nonlinear dynamic system 10. The coupling topology considered for this embodiment of the nonlinear dynamic system 10 comprises an inner feedback loop in each nonlinear component 12. This approach results in a reduction of the characteristic oscillation frequency of the system, thus an increase in the period is observed. Each of the nonlinear components 12 shown in FIG. 2 comprises a ferromagnetic core 18, an instrumentation amplifier (INA) 20, an integrator 22, a voltage-current converter 24, a filter 26, a second amplifier 28, and a power source 30. The instrumentation amplifier 20 may be used to pick-up the differential output voltage 32 from the output winding of the corresponding ferromagnetic core 18. The instrumentation amplifier 20 also may provide a voltage gain. The integrator 22 calculates a signal proportional to the magnetic flux. In fact, the output voltage signal from the integrator 22 is proportional to the derivative of the magnetic flux. The voltage-current convertor 24 allows the next-in-line ferromagnetic core 18 to be driven with a current signal that is proportional to the magnetic flux in the preceding core 18 after this has been amplified by the coupling gain. The filter 26 removes spurious components from the signal before feeding it back into the core elements 18. The dynamics in equation (7) may be modified to:

$$\begin{cases} \dot{x}_1 = -x_1 + \tanh[c(x_1+\lambda(x_3-x_1)+H_x)] \\ \dot{x}_2 = -x_2 + \tanh[c(x_2+\lambda(x_1-x_2)-H_x)] \\ \dot{x}_3 = -x_3 + \tanh[c(x_3+\lambda(x_2-x_3)+H_x)] \end{cases} \quad \text{Equation (8)}$$

The magnetization of each core 18 element $x_i(t)$ depends not only on the target signal $H_x$ but, also (recalling that $\lambda$ is negative), more strongly depends on its own state than in the coupled system characterized by equation (3). In other words, the feedback is incorporated into the integrator output, and the adder changes the signal sign and subtracts it from the original field excitation. Remembering that $\lambda<0$, it is clear that a larger signal is fed into each core. This means that, with this setup, a lower gain value is required to saturate the cores 18.

Equations (5) and (6) above hold for a direct current (DC) target signal $H_x$. However, when the target signal is AC, quantifying performance in terms of Resident Times Difference becomes problematic because of two competing frequencies in the sensor dynamics: the target signal frequency vs. the spontaneous oscillation frequency. Accordingly, traditional quantification of performance in terms of the response power spectral density (PSD) may be used. For a weak cyclic target signal, one can encounter a situation wherein the signal is below the noise-floor and, therefore, undetectable. This problem can be, somewhat, mitigated by using a very long observation time (and, hence, having much larger data sets to average when computing the PSD).

For many practical applications, one does not have the luxury of a long observation time. Hence, it may be desirable to invoke dynamical techniques to lower the noise-floor. Injection locking may be used for this purpose. Unlike the conventional (second-harmonic based) readout of the single core fluxgate magnetometer, one may expect to be able to detect the time-periodic signal (using the CCFG) directly at its frequency in the PSD. Of course, one could also detect the target signal by examining its mixing (with the natural oscillation frequency of the CCFG output, in the absence of the target signal) components as they appear in the response PSD. In either case, if the target signal has very low amplitude, injection locking enhances its detection and quantification, which is evidenced by both simulation and experiment described below.

The CCFG affords a logical application of injection locking, because the magnetometer may be operated in the oscillatory regime past the bifurcation threshold. Theoretically, the system should afford its maximal sensitivity close to the bifurcation threshold (i.e. in the low frequency regime), however, in this regime, noise floor problems can be particularly acute, thereby necessitating some form of noise mitigation. In what follows, we detail the results of applying injection locking to the CCFG magnetometers. The locking signal is applied, externally, to the CCFG; hence, it appears in the system equations (8) as a periodic bias magnetic field, $H_{Lock}(t)$, added to the target magnetic field $H_x(t)$.

Figure 3:
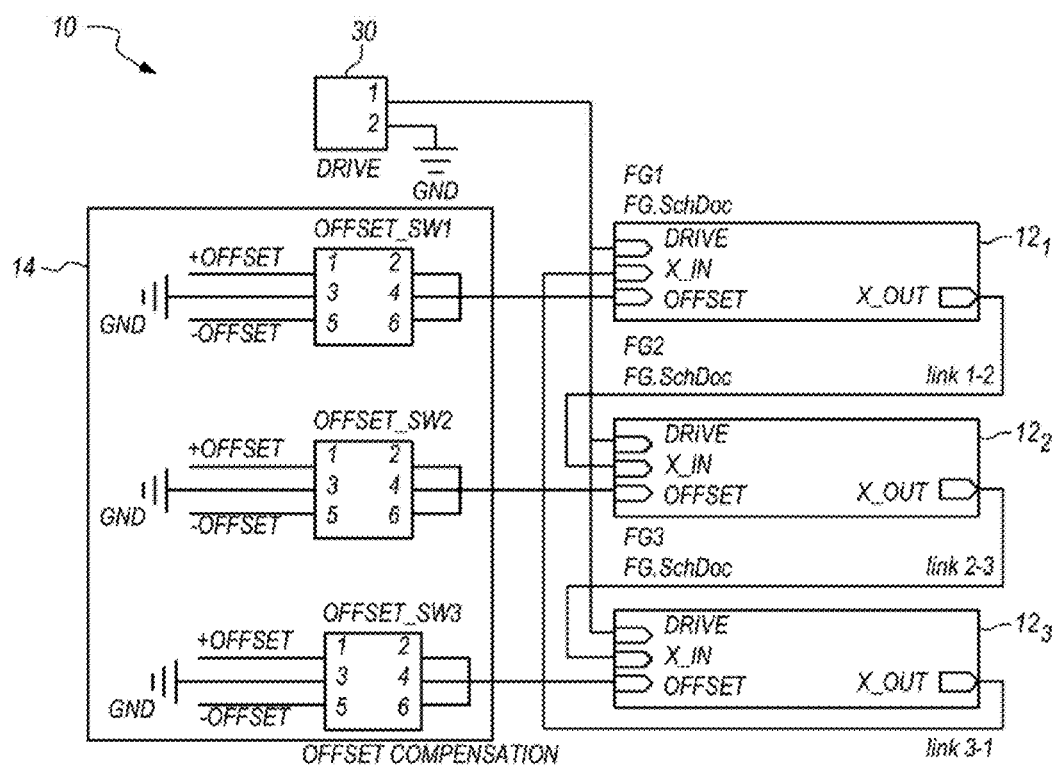
FIG. 3 is an illustration of an embodiment of a nonlinear dynamic system.

FIG. 3 is an illustration of an experimental circuit prototype of the nonlinear dynamic system 10 that implements the coupling scheme shown in FIG. 2. In the prototype embodiment, the circuit consisted of three (wound with primary and secondary coils) coupled ferromagnetic cores 18 based on 100 μm FeSiB amorphous ferromagnetic core material. The cores 18 were then coupled through electronic circuits, based on the equations (8), where the (voltage) readout of one output signal (the derivative signal of the flux detected by the sensing coil) was amplified through the instrumentation amplifier 20 and filtered. The signal was integrated to obtain a signal proportional to the magnetic flux. Finally, after a suitable amplification, the signal was used simultaneously both to manage a voltage-to-current converter for driving the primary coil of the adjacent core 18 and to close the internal feedback loop. The three cores 18 in this embodiment were mounted on the faces of a triangular structure to be oriented all along the same direction. In this embodiment a calibrated solenoid was used to apply both the locking and the target magnetic fields. Alternatively, the cores 18 may be mounted to any structure that allows them to be oriented all along the same direction. For example, the cores 18 may be mounted on a cylinder such that all the cores are oriented to be parallel with an axis of the cylinder.

Figure 4:
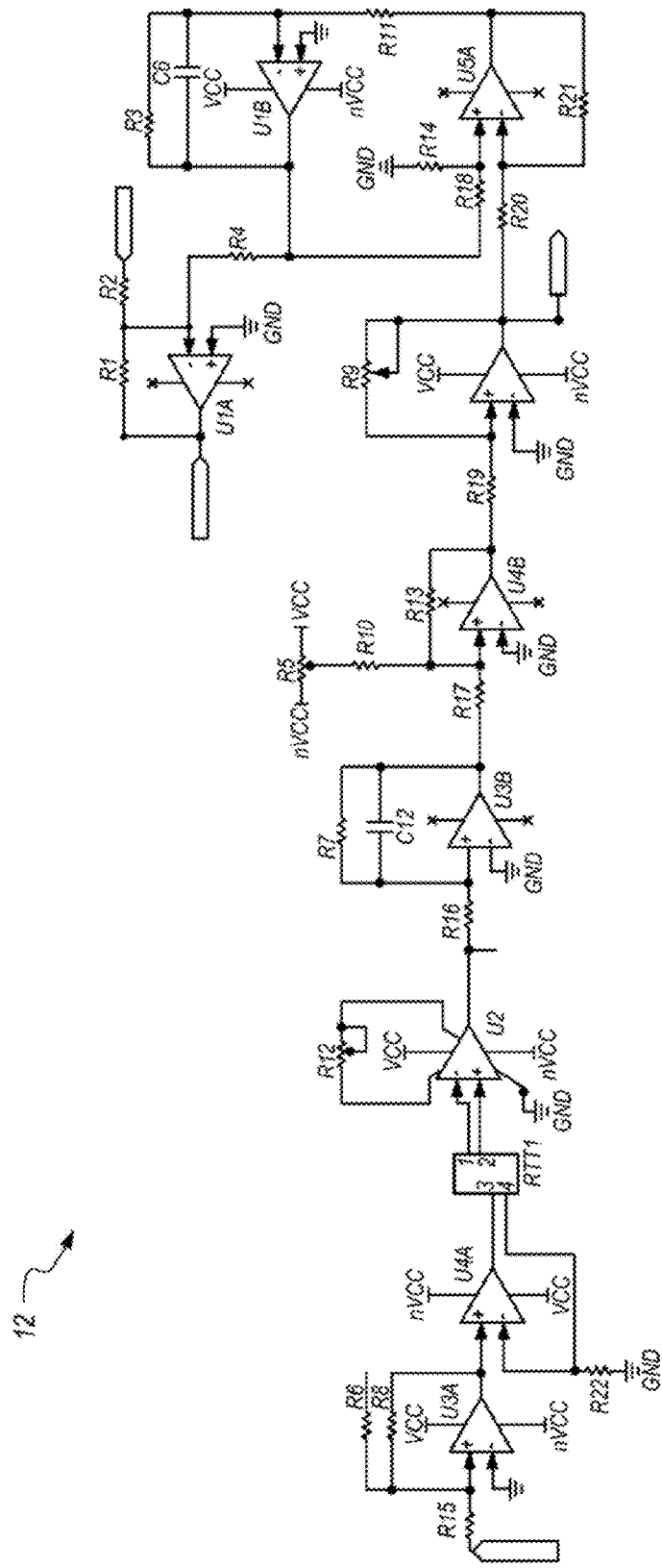
FIG. 4 is a schematic of an electronic circuit for an embodiment of a nonlinear component.

FIG. 4 is a schematic of an electronic circuit for an embodiment of a nonlinear component 12. In this embodiment, a solenoid with known characteristics (R=50, L=0.4 m, N=800) was used in order to produce a known value of both the target and the sinusoidal locking signals. The effects of the environmental noise were minimized by performing the measurements inside a magnetic shield made by three layers of Metglas®, which is a thin amorphous metal alloy ribbon. The spontaneous frequency of oscillations, for the selected gain, was about 500 Hz. Each wave was phase shifted by $2\pi/3$.

Figure 5:
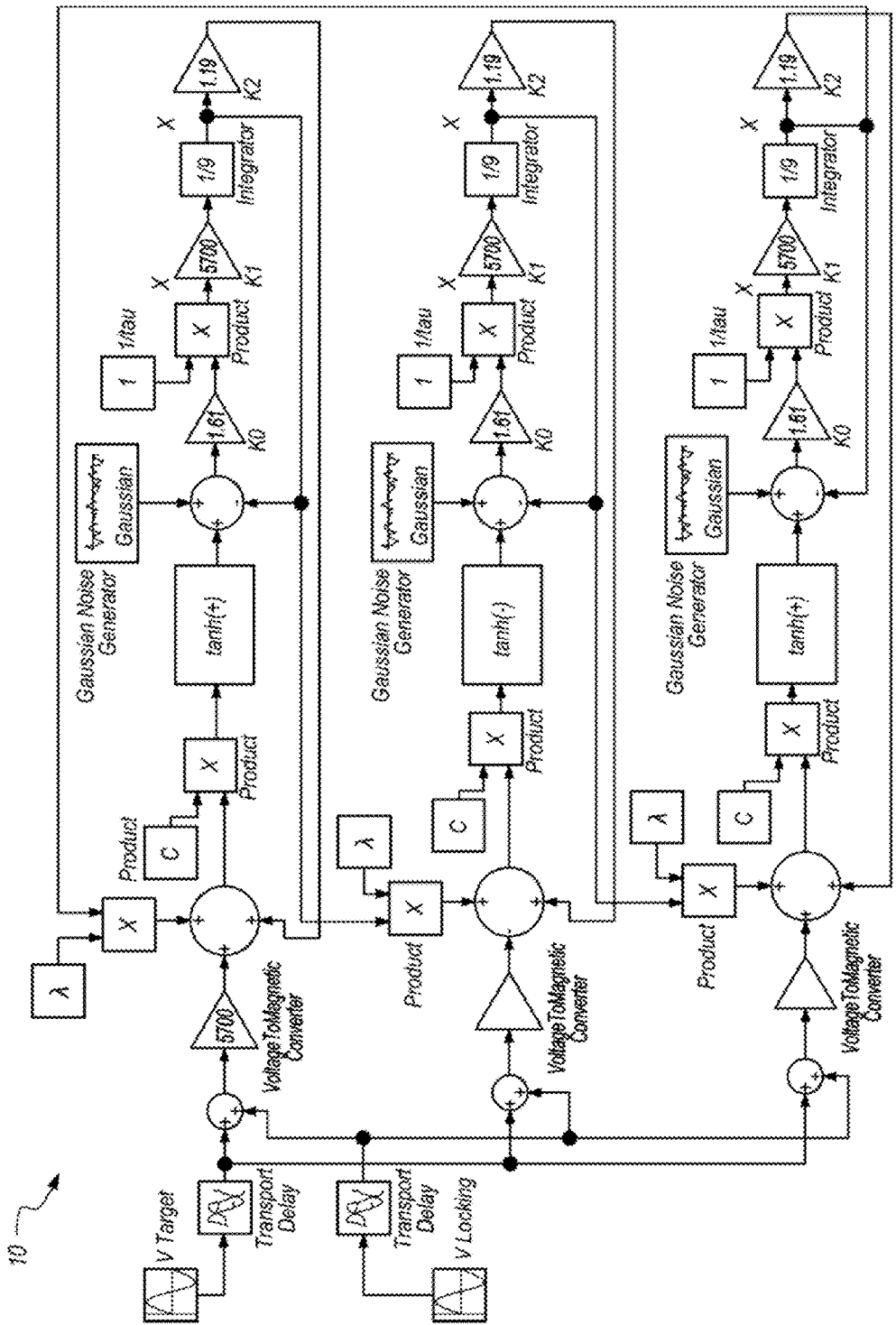
FIG. 5 is a simulation model of an embodiment of the nonlinear dynamic system.

FIG. 5 is a schematized Simulink® simulation model of an embodiment of the nonlinear dynamic system 10. In order to obtain a highly representative numerical model of the real circuit depicted in FIG. 4, a parameter identification procedure was performed by using data gathered from the experimental circuit prototype. In fact, while most of the circuit parameters are readily obtainable from the circuit, the magnetic properties of the wound cores model are more difficult to extract, quantitatively, and are better derived from their effects on the signal behaviors. In the following equations the coefficients that are identified from experimental measurements on the circuit prototype are shown.

$$\begin{cases} \dot{x}_1 = -K_0K_1x_1 + K_0K_1\tanh[c(K_3x_1 + \lambda(x_3 - x_1) + H_x)] \\ \dot{x}_2 = -K_0K_1x_2 + K_0K_1\tanh[c(K_3x_2 + \lambda(x_1 - x_2) + H_x)] \\ \dot{x}_3 = -K_0K_1x_3 + K_0K_1\tanh[c(K_3x_3 + \lambda(x_2 - x_3) + H_x)] \end{cases} \quad \text{Equation (9)}$$

The parameter set that was identified included ($K_0, K_1, K_3, \lambda$) as well as the (temperature-dependent) parameter c which controls the bistability of an isolated element. The parameters $K_0$, $K_1$ and $K_3$ were necessary to adjust the simulated signal amplitude and frequency to the experimentally measured data. The parameter $K_2=K_3+\lambda$ in FIG. 5 was used only for the experimental implementation. Finally, $\lambda$ is the coupling coefficient; it is the characteristic coupling gain that multiplies the state x within the nonlinearity. The coupling coefficient 2 is obtained as the product of the amplifier's gains K1 and K2 and the magnetic permeability of the magnetic core with also a coefficient (conversion flux to voltage) that were not able to be analytically modeled. The relevant parameters may be obtained experimentally without target and locking signals and then using numerical filling using a simplex method to reduce the error in the fitting process.

Still referring to FIG. 5, the parameter identification procedure was accomplished using the Dantzig's simplex algorithm, same as the simplex method mentioned above, starting from experimentally acquired signals. The resultant parameter values were: $K_0$=1.61 [$Hm^{-3}$], $K_1$=5700, $K_3$=0.65, $\lambda$=−0.54, and c=1.26. Note that, for a single isolated element, the block $K_2=K_3+\lambda$ was absent and the condition c>1 for bistability was satisfied. The response of each core is a voltage vs time signal; it shows the characteristic sequence of alternating positive and negative spikes. The integrator 22, shown in FIG. 2, converts this signal into a $x_i(t)$ vs. t output, which has the oscillatory characteristics of relaxation oscillations close to the critical point. The Simulink® model was validated to be representative of the real circuit.

Figure 6A:
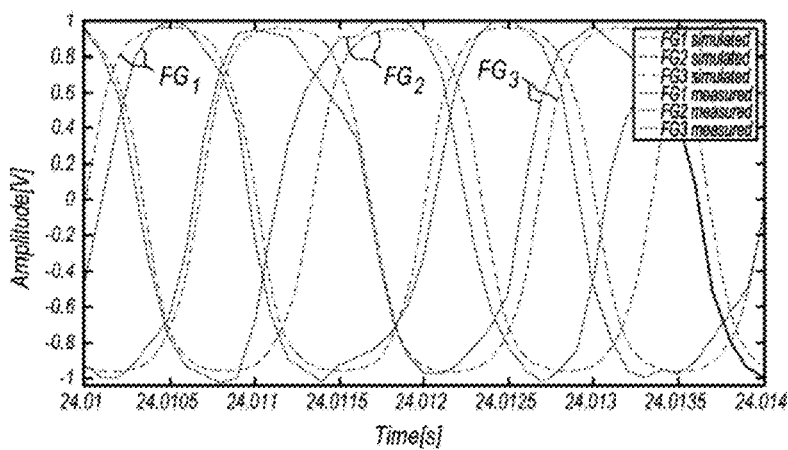
FIG. 6A is a time-domain comparison plot.

FIG. 6A is a time-domain comparison between the experimentally measured vs. computed (via direct simulation of the system characterized by equation (9)) time series for all three outputs $x_i(t)$, which yields very good agreement. In the comparison, in the time domain, shown in FIG. 6A, between the simulated signal and the measured signal from the output of all three cores ($FG_1$, $FG_2$, and $FG_3$), the measured and simulated curves are shown by solid and dashed lines, respectively.

Figure 6B:
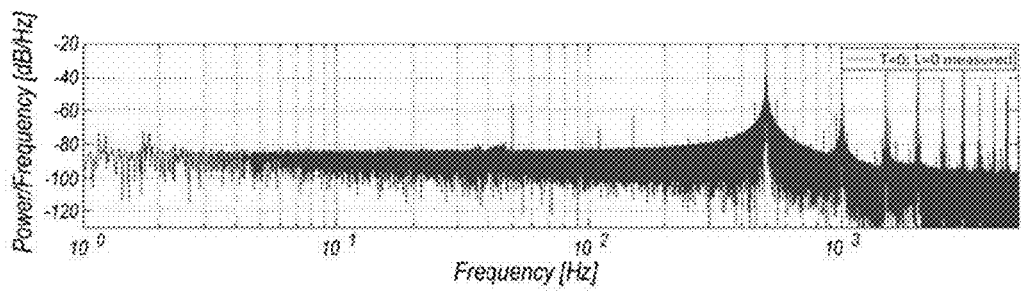
FIGS. 6B and 6C are respectively plots of measured and simulated output signals.
Figure 6C:
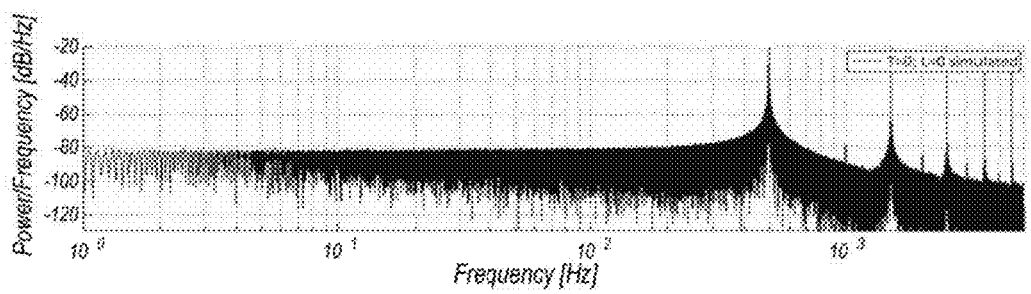

FIGS. 6B and 6C are respectively plots of measured and simulated output signals. The PSD of the output signal (reported in dB) is shown in FIGS. 6B and 6C for both the measured and the simulated cases respectively.

It is of interest to calculate the critical coupling parameter $\lambda_c$ at which switching events start to occur, in the dynamics of the system characterized by equation (9). This threshold value is, clearly, a function of the parameters ($cK_3$). For the purposes of the calculation we set the target signal $H_x$=0. The calculation would be affected by the presence of a DC target signal, however this case is not currently considered. Accordingly, the critical coupling will represent the threshold at which switching events occur in the absence of an external driving signal. The calculation exploits the unidirectional coupling which ensures that the switching events occur sequentially in each core magnetization variable; this means that while (e.g.) the element $x_1$ is switching from one of its stable states (recall that each core element is underpinned by a bistable potential energy function, when isolated) to the other, the remaining elements are in their stable states ($x_{20}$, $x_{30}$) which, because of the tan h function in the dynamics, can be taken to be at, approximately, ±1.

Focusing on the $x_1$ dynamics we note that, as this element switches, the element ($x_3$) to which it is coupled can be replaced by its steady state value $x_{30}$. Then, the $x_1$ dynamics may be cast in the form:

$$\dot{x}_1 = -x_1 + \tan hc[(K_3-\lambda)x_1+\lambda x_{30}] \equiv f(x_1) \quad \text{Equation (10)}$$

which corresponds to a particle-in-potential system, having a potential energy function as follows:

$$U(x_1) = \frac{x_1^2}{2} - \frac{1}{c(K_3-\lambda)}\ln\cosh c[(K_3-\lambda)x_1+\lambda x_{30}] \quad \text{Equation (11)}$$

Note that $f(x_1)=-U'(x_1)$ the prime denoting the derivative with respect to $x_1$. Note, also, that we have omitted the parameters $K_{0,1}$ in the above description, since these are simply temporal scaling parameters introduced to facilitate the comparison between the temporal behavior of $x_i$ as obtained via experiments and simulations. Also note that the coupled system as characterized in equation (9) cannot be represented by a 3-variable particle-in-potential paradigm because of the unidirectional coupling. However, the reduced dynamics of any element (e.g. $x_1$ above) during its dynamical switching interval can, in fact be represented via a potential energy function (during the switching cycle, $x_{30}$ is a constant which just skews the potential energy function).

The switch occurs when the potential energy function develops an inflexion point, which means that one of the stable fixed points of the potential merges with the unstable (saddle) point to create a "ramp" along which the state-point "rolls" into the opposite well (we assume that the switches are instantaneous, once the inflexion point is reached). The inflexion point $x_i$ is obtained by setting $U'(x_1)=0=U''(x_1)$, which yields, after a straightforward calculation:

$$x_i = \pm\sqrt{\frac{c(K_3-\lambda)-1}{c(K_3-\lambda)}} \qquad \text{Equation (12)}$$

It follows that the coupling parameter should be negative. The remainder of the calculation consists of substituting the above expression for $x_i$ into the right hand side (RHS) of equation (10) and solving the equation $f(x_1)=0$ for the critical value $\lambda_c$ at the inflexion point.

The expression $f(x_1)$ has only 3 roots, which correspond to the fixed points of the potential energy from equation (11). Solving the equation $f(x_1)=0$ is impossible, analytically. However, one can simplify the calculation by expanding the function $f(x_1)$ in a power series about the uncoupled case ($\lambda=0$). It can be shown (graphically) that an expansion to O ($\lambda_c^3$) yields extremely good agreement with the numerical solution of $f(x_1)=0$, and an expansion to O ($\lambda_c^2$) is only slightly less accurate. In both the expanded equations for $f(x_1)$, one could, analytically, compute the inflexion point from the roots.

Figure 7A:
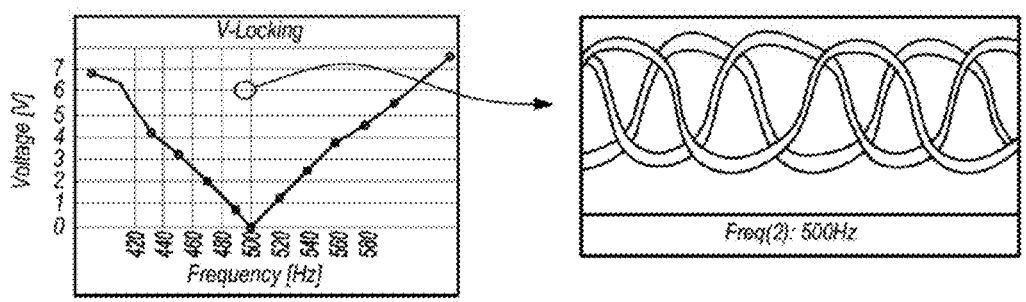
FIGS. 7A and 7B are plots illustrating Arnold tongues.
Figure 7B:
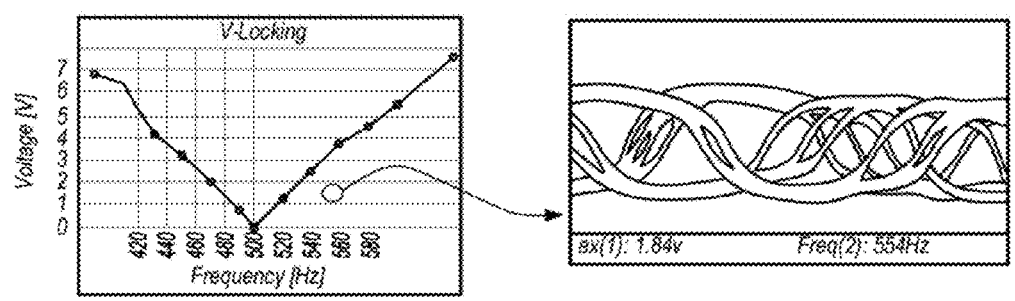

FIGS. 7A and 7B are plots illustrating Arnold tongues. An Arnold tongue may be described as the region of the parameters (amplitude and frequency) space in which a suitably selected locking signal will, in fact, maintain the synchronization between the responses of each core element while, simultaneously, lowering the noise-floor. The spontaneous oscillation frequency, for the CCFG experimental circuit shown in FIGS. 3 and 4 is 500 Hz. The right panel of each of FIGS. 7A and 7B shows the (experimentally obtained) time series from each ferromagnetic core 18; these panels are snapshots of an oscilloscope screen. The synchronization is evident in FIG. 7A, wherein the phase offset between the magnetization variable oscillations from each core is precisely $\pi/3$. As the detuning approaches zero, the just sufficient (for synchronization) locking amplitude decreases. Outside the tongue, the synchronization is imperfect, as seen in FIG. 7B. The locking signal is presented as an external controllable time-sinusoidal signal capable of locking to the system oscillation frequency. Specifically, the locking signal must lie inside the Arnold tongue, such as is shown in FIG. 7A, then, the oscillator is locked or synchronized.

Figure 8A:
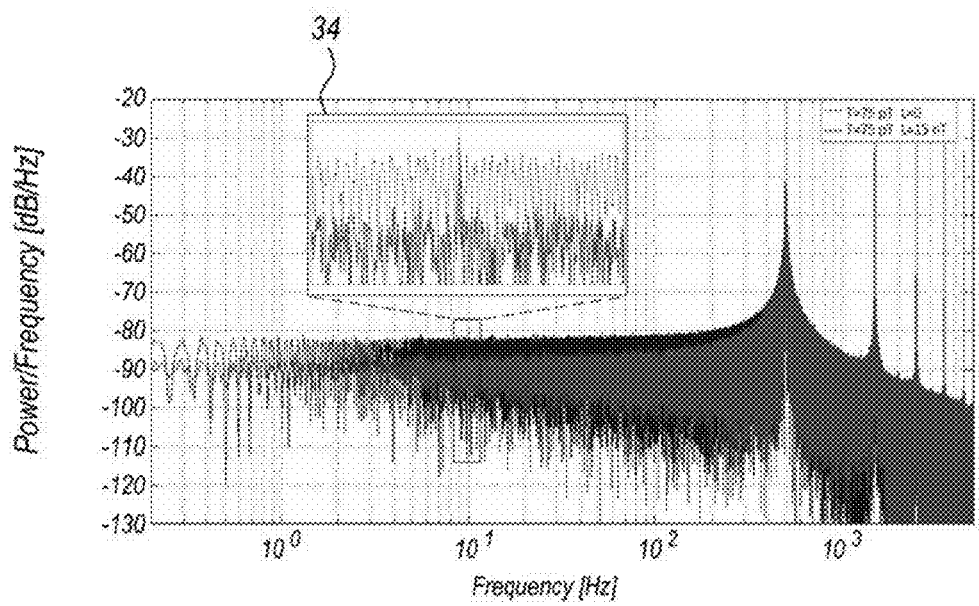
FIG. 8A is a plot of the simulated power spectral density of an output signal.

FIG. 8A is a plot of the simulated PSD of the output signal $x_1(t)$ in equation (9). The red trace represents the PSD output with injection locking. The blue trace represents the PSD output with no signal locking. The target signal is 75 pT applied at 10 Hz. The locking signal has amplitude 15 nT and is applied at the spontaneous oscillation frequency (500 Hz). The case with no locking signal is shown as a blue spectrum that displays the natural running frequency at 500 Hz and the large noise-floor at low frequency. The red spectrum refers to the case of applied locking signal at the same natural frequency (500 Hz); a significant reduction of the noise-floor at low frequencies is evident. A portion of the plot of FIG. 8A is magnified and shown in the inset box 34.

Figure 8B:
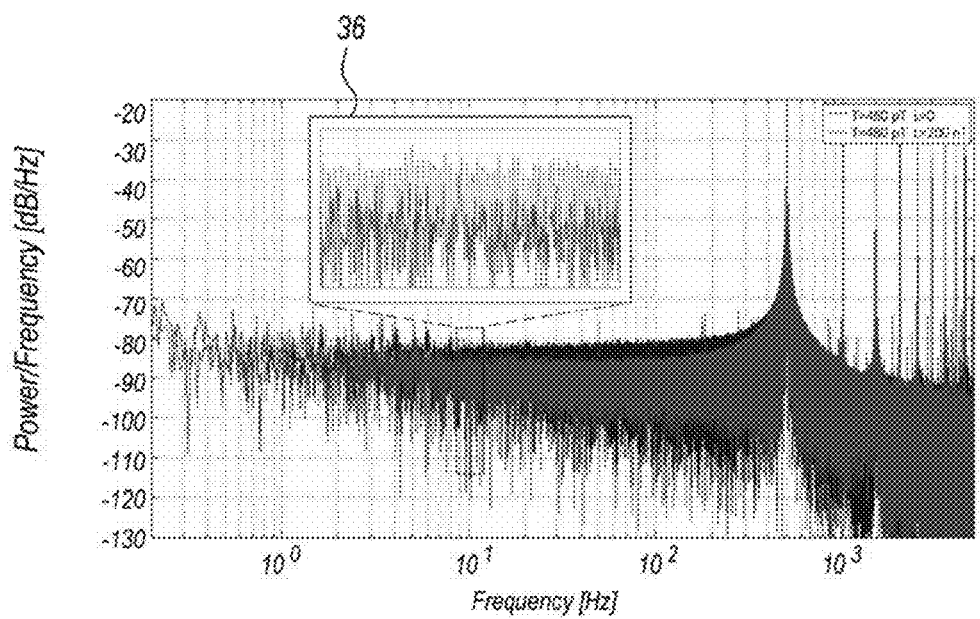
FIG. 8B is a plot of the measured power spectral density of an output signal.

FIG. 8B is a plot of the measured PSD response obtained from core element FG1 (meaning the PSD of the response of $x_1$), in the alternating orientation configuration characterized by equation (7) with a 10 Hz target signal having 0.48 nT amplitude. The red trace represents the PSD output with injection locking. The blue trace represents the PSD output with no signal locking. The locking signal is applied at 500 Hz and has amplitude 200 nT. A portion of the plot is magnified and shown in the inset box 36. As can be seen in the magnified portion in inset box 36, the target signal (at 10 Hz) would not be discernable without the locking signal. In other words, the 10 Hz target signal would not be above the noise-floor without the locking signal.

Figure 9:
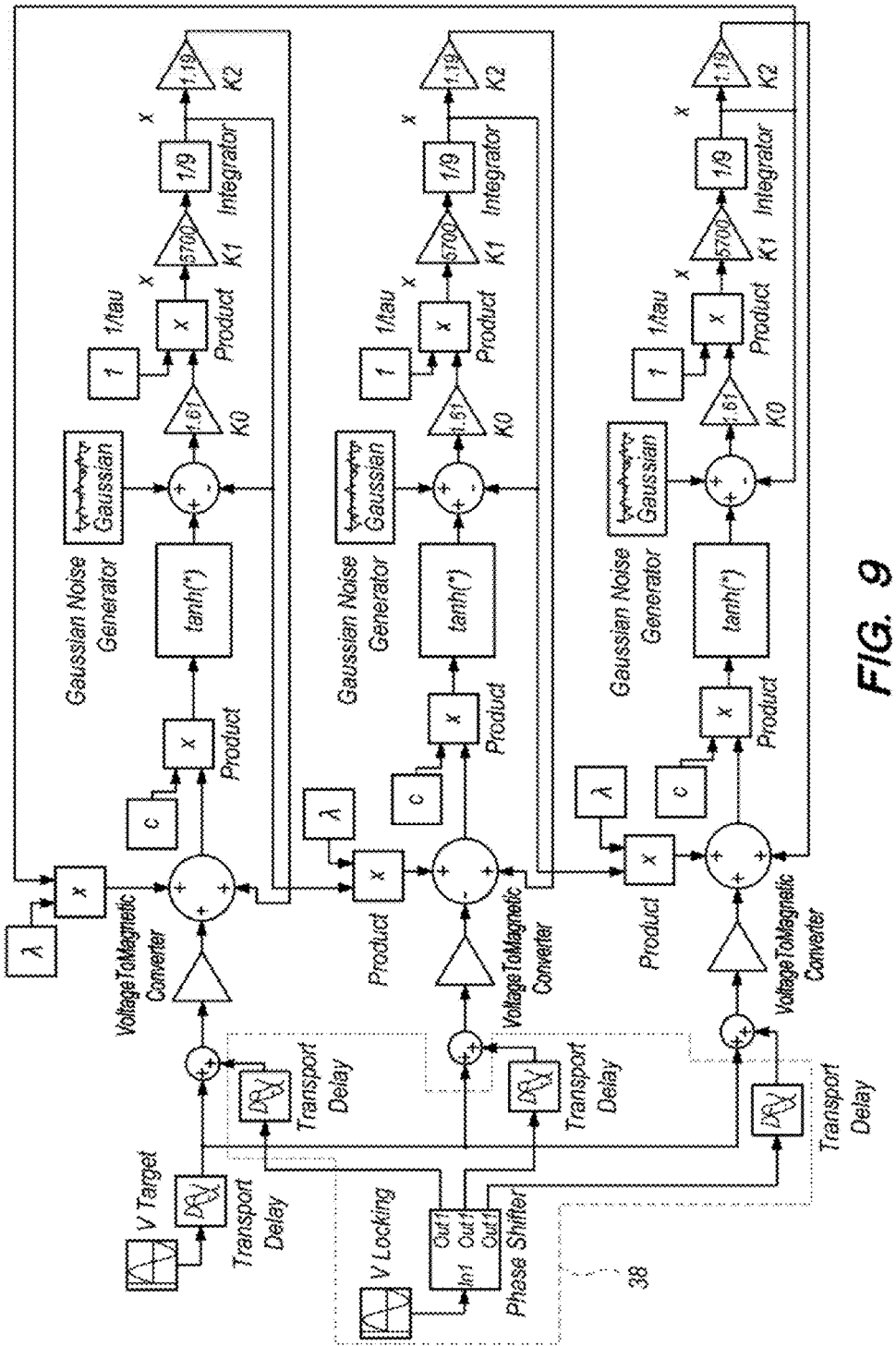
FIG. 9 is a simulation model of an embodiment of the nonlinear dynamic system.

FIG. 9 is a schematized Simulink® simulation model of an embodiment of the nonlinear dynamic system 10. The embodiment of the nonlinear dynamic system 10 depicted in FIG. 9 may be described as a customized injection locking embodiment in that the phase shift of $2\pi/3$ between two consecutive output signals is exploited. In this customized injection locking embodiment, the locking signal is "split" into three coherent components, each one is phase shifted by $2\pi/3$. The subsystem 38 that generates the three phase-shift locking signal can be observed in the Simulink® model shown in FIG. 9. The locking signal inserted directly inside the non-linearity amplifies the target signal effects in the same way in all three cores. It is possible to think of this version of injection locking as an amplification method of the target signal, because it leads to core saturation in a shorter time; this yields a sharper hysteresis loop for the magnetization response of each core accompanied by a concomitant lowering of the critical value $\lambda_c$.

Figure 10:
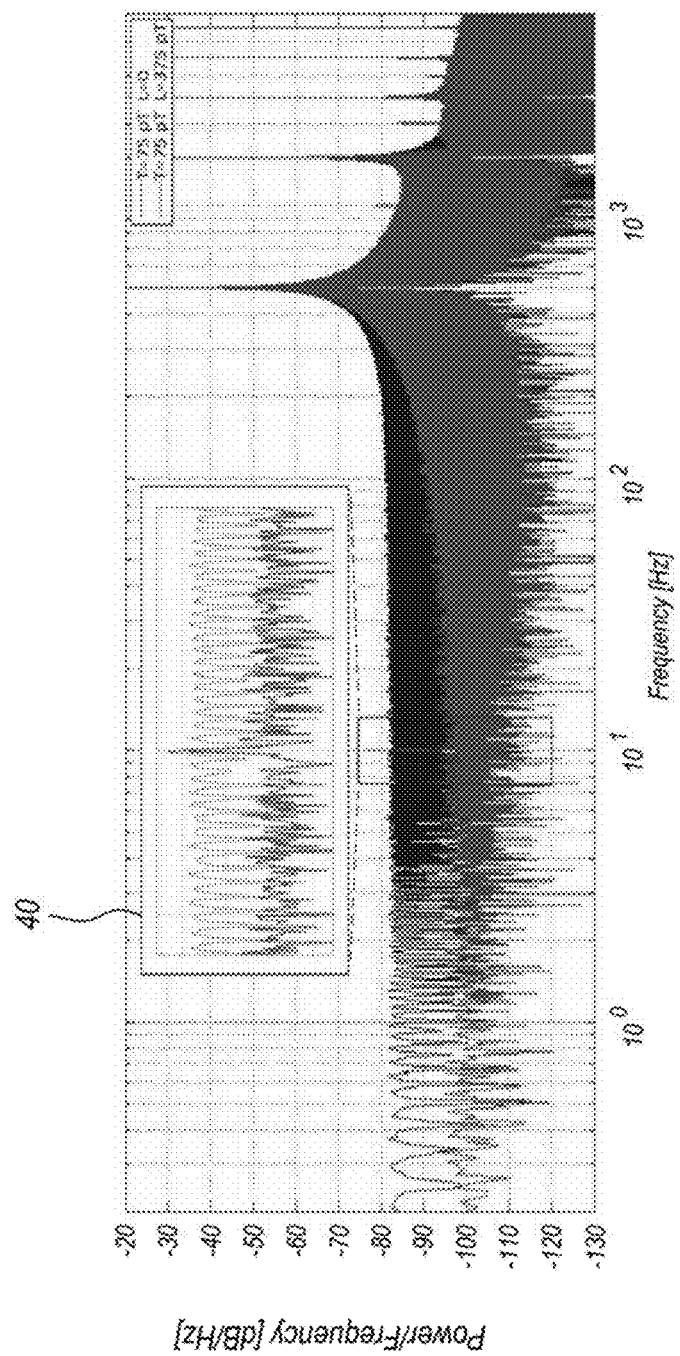
FIG. 10 is a plot of the measured power spectral density of an output signal.

FIG. 10 is a plot of the simulated PSD of the output signal $x_1(t)$ of the customized injection locking embodiment. The target signal was a 10 Hz signal with a 75 pT amplitude. The blue curve corresponds to zero locking amplitude, and the red corresponds to a locking amplitude of 375 pT (applied at the spontaneous system oscillation frequency). The magnified segment of the plot in the insert 40 shows the peak at the target frequency (10 Hz).

Injection locking may be applied to sensors which are operated in a post-bifurcation regime wherein the dimensionality of the system (in an example case N=3) leads to oscillatory behavior. The injection locking signal may, then, be applied at a frequency close to that of the spontaneous oscillations, and given when larger than a minimum amplitude it has (assuming that it is time-sinusoidal) the effect of narrowing the spectral features (these are not, generally delta functions because the spontaneous oscillations are nonsinusoidal) at multiples of the spontaneous frequency while, simultaneously, leading to a lowering of the noise-floor at all frequencies but most pronounced at low frequency. The target signal can, then, be directly detected at its input frequency; in addition, one can detect the target signal via its mixing harmonics with the spontaneous oscillation frequency and its harmonics.

Figure 11:
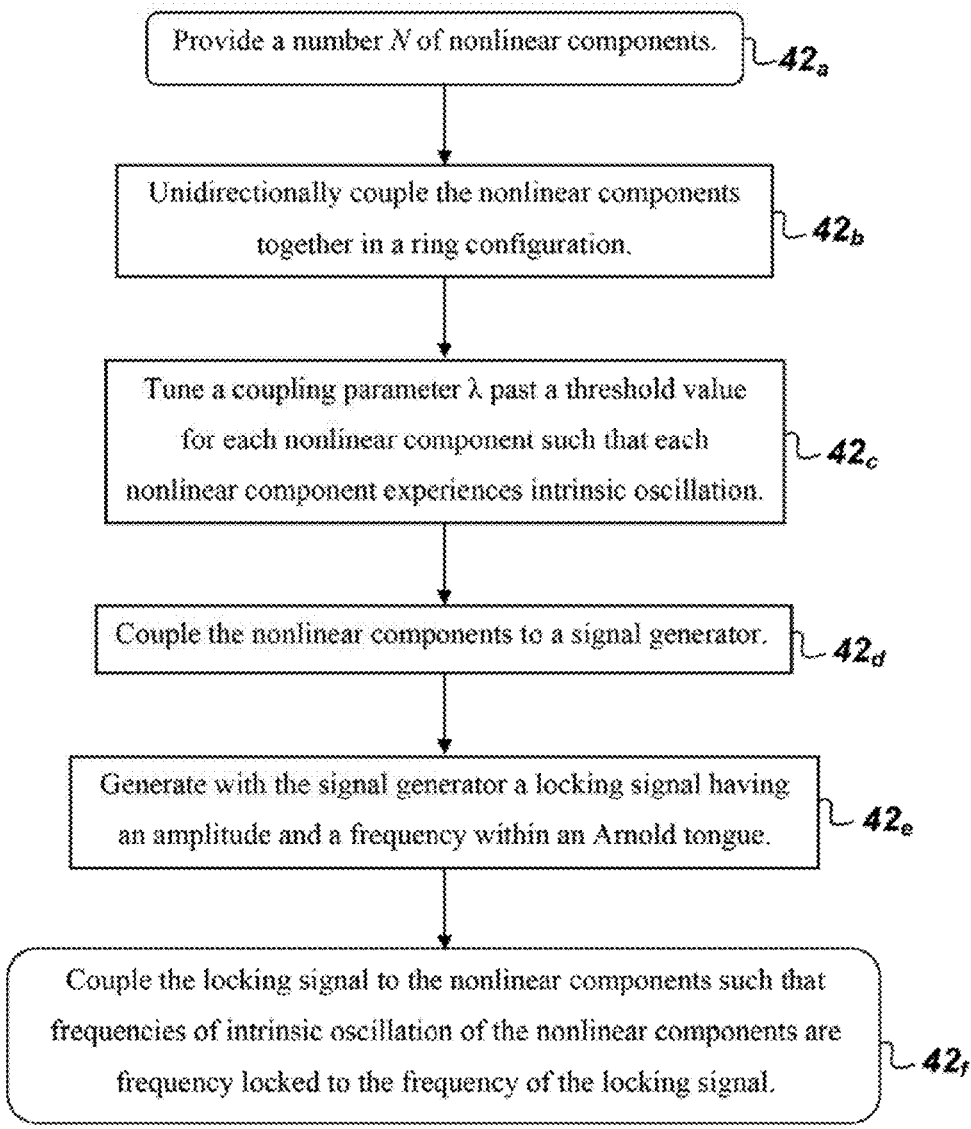
FIG. 11 is a method flowchart.

FIG. 11 is a flowchart of a method for providing a nonlinear dynamic system 10. The first step $42_a$ involves providing a number N of nonlinear components. Then next step $42_b$ provides for unidirectionally coupling the nonlinear components together in a ring configuration. Then next step $42_c$ provides for tuning a coupling parameter $\lambda$ past a threshold value for each nonlinear component such that each nonlinear component experiences intrinsic oscillation. Then next step $42_d$ provides for coupling the nonlinear components to a signal generator. Then next step $42_e$ provides for generating with the signal generator a locking signal having an amplitude and a frequency within an Arnold tongue. Then next step $42_f$ provides for coupling the locking signal to the nonlinear components such that frequencies of intrinsic oscillation of the nonlinear components are frequency locked to the frequency of the locking signal.

$$\begin{cases} \dot{x}_1 = -x_1 + \tanh c(x_1 + \lambda x_2 + H_x\sin\omega_x t + H_L\sin\omega_L t) \\ \dot{x}_2 = -x_2 + \tanh c(x_2 + \lambda x_3 + H_x\sin\omega_x t + H_L\sin\omega_L t) \\ \dot{x}_3 = -x_3 + \tanh c(x_3 + \lambda x_1 + H_x\sin\omega_x t + H_L\sin\omega_L t) \end{cases}$$

From the above description of the nonlinear dynamic system 10, it is manifest that various techniques may be used for implementing the concepts of system 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that system 10 is not limited to the particular embodiments described herein, but is capable of many embodiments without departing from the scope of the claims.

We claim:

1. A nonlinear dynamic system comprising:
   a number N of nonlinear components, wherein each nonlinear component experiences intrinsic oscillation when a coupling parameter $\lambda$ is tuned past a threshold value, and wherein the nonlinear components are unidirectionally coupled together in a ring configuration; and
   a signal generator configured to generate N coherent locking signals; wherein each locking signal is phase shifted by $2\lambda/N$ with respect to the other locking signals; and wherein the signal generator is coupled to the nonlinear components such that each locking signal locks a frequency of the intrinsic oscillation of one of the nonlinear components to a frequency of the locking signal.

2. The system of claim 1, wherein N is odd.

3. The system of claim 2, wherein N is three.

4. The system of claim 1, wherein N>>2.

5. The system of claim 3, wherein each nonlinear component comprises a wound ferromagnetic core.

6. The system of claim 5, wherein each nonlinear component further comprises an instrumentation amplifier, an integrator, a voltage-current converter, a filter, an amplifier, and a power source.

7. The system of claim 6, wherein the ferromagnetic cores are coupled with a cyclic boundary condition such that:

$$\begin{cases} \dot{x}_1 = -x_1 + \tanh c(x_1 + \lambda x_2 + H_x\sin\omega_x t + H_L\sin\omega_L t) \\ \dot{x}_2 = -x_2 + \tanh c(x_2 + \lambda x_3 + H_x\sin\omega_x t + H_L\sin\omega_L t) \\ \dot{x}_3 = -x_3 + \tanh c(x_3 + \lambda x_1 + H_x\sin\omega_x t + H_L\sin\omega_L t) \end{cases}$$

where $x_i(t)$, (i=1, 2, 3) represents a magnetic flux at an output of a secondary coil of unit i, $H_x$ is an external target signal, $H_L$ is the locking signal, $\omega_x$ is a frequency of the target signal, and $\omega_L$ is the frequency of the locking signal, $\lambda$ is a coupling parameter, and c is a parameter that is inversely proportional to system temperature, wherein a potential energy function is bistable for c>1.

8. The system of claim 1, wherein the system does not utilize a bias signal.

9. The system of claim 7, wherein an orientation of the nonlinear component's ferromagnetic cores alternate such that $H_x$ alternates from positive to negative between all but two nonlinear components.

10. The system of claim 5, further comprising a support structure in the shape of a triangular prism having an axis and three separate faces, wherein each of the nonlinear components is mounted to one of the separate faces such that the ferromagnetic cores of all three nonlinear components are oriented parallel to the axis.

11. The system of claim 10, wherein the external target signal $H_x$ is an alternating current magnetic signal.

12. The system of claim 1, wherein each locking signal is an external, controllable, time-sinusoidal signal capable of locking the intrinsic oscillation of one of the nonlinear components.

13. The system of claim 1, wherein each of the locking signals is within an Arnold tongue.

14. A method comprising:
   providing a number N of nonlinear components;
   unidirectionally coupling the nonlinear components together in a ring configuration;
   tuning a coupling parameter $\lambda$ past a threshold value for each nonlinear component such that each nonlinear component experiences intrinsic oscillation;
   coupling the nonlinear components to a signal generator;
   generating with the signal generator a locking signal having an amplitude and a frequency within an Arnold tongue; and
   coupling the locking signal to the nonlinear components such that frequencies of intrinsic oscillation of the nonlinear components are frequency locked to the frequency of the locking signal.

15. The method of claim 14, wherein the locking signal comprises N coherent locking signals that are phase shifted by $2\lambda/N$ with respect to each other, and further comprising coupling each of the N coherent locking signals to a corresponding nonlinear component such that an intrinsic oscillation frequency of each nonlinear component is frequency locked to a frequency of the corresponding locking signal.

16. The method of claim 15, wherein N is odd.

17. The method of claim 16, wherein each nonlinear element comprises a ferromagnetic core, and wherein the ferromagnetic cores are coupled with a cyclic boundary condition such that if N were equal to three the following would be true:

$$\begin{cases} \dot{x}_1 = -x_1 + \tanh c(x_1 + \lambda x_2 + H_x\sin\omega_x t + H_L\sin\omega_L t) \\ \dot{x}_2 = -x_2 + \tanh c(x_2 + \lambda x_3 + H_x\sin\omega_x t + H_L\sin\omega_L t) \\ \dot{x}_3 = -x_3 + \tanh c(x_3 + \lambda x_1 + H_x\sin\omega_x t + H_L\sin\omega_L t) \end{cases}$$

where $x_i(t)$, (i=1, 2, 3) represents a magnetic flux at an output of a secondary coil of unit i, $H_x$ is an external target signal, $H_L$ is the locking signal, $\omega_x$ is a frequency of the target signal, and $\omega_L$ is the frequency of the locking signal, $\lambda$ is a coupling parameter, and c is a parameter that is inversely proportional to system temperature, wherein a potential energy function is bistable for c>1.

18. The method of claim 17, further comprising the step of monitoring performance of the unidirectionally-coupled nonlinear elements to detect alternating current magnetic target signals without utilizing a bias signal.

* * * * *